(12) United States Patent
Kulkarni et al.

(10) Patent No.: US 10,673,455 B2
(45) Date of Patent: Jun. 2, 2020

(54) SAMPLE AND HOLD CIRCUIT WITH INDEFINITE HOLDING TIME

(71) Applicant: Texas Instruments Incorporated, Dallas, TX (US)

(72) Inventors: Rahul Vijay Kulkarni, Bangalore (IN); Shridhar Atmaram More, Bangalore (IN); Kaustubh Ulhas Gadgil, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/977,910

(22) Filed: May 11, 2018

(65) Prior Publication Data
US 2019/0348993 A1 Nov. 14, 2019

(51) Int. Cl.
*H03M 1/12* (2006.01)
*H03M 1/46* (2006.01)

(52) U.S. Cl.
CPC ................... *H03M 1/468* (2013.01)

(58) Field of Classification Search
CPC ...... H03M 1/38; H03M 1/468; H03M 1/1245; H03M 1/462; H03M 1/466; H03M 1/46; H03M 1/12; H03M 1/1009; H03M 1/124; H03M 1/002; H03M 1/1215
USPC ................ 341/155, 172, 150, 163
See application file for complete search history.

(56) References Cited

U.S. PATENT DOCUMENTS

| | | | | |
|---|---|---|---|---|
| 4,200,863 A * | 4/1980 | Hodges | ............. | H03M 1/38 341/156 |
| 4,641,130 A * | 2/1987 | Mastroianni | .......... | H03M 1/403 341/136 |
| 4,922,252 A * | 5/1990 | Draxelmayr | ........ | H03M 1/1023 341/120 |
| 5,576,708 A * | 11/1996 | De Wit | .............. | H03M 1/0607 341/118 |
| 7,741,981 B1 * | 6/2010 | Wan | ................. | H03M 1/02 341/110 |
| 2011/0080925 A1 * | 4/2011 | Molina | ............... | H03M 1/0872 370/538 |
| 2012/0075128 A1 * | 3/2012 | Aruga | ................. | H03M 1/1019 341/110 |
| 2012/0218137 A1 * | 8/2012 | Yoon | ................. | H03M 1/16 341/172 |
| 2012/0218235 A1 * | 8/2012 | Peng | .................. | G09G 3/3688 345/204 |
| 2012/0280841 A1 * | 11/2012 | Wang | ................. | H03M 1/1295 341/110 |
| 2012/0326901 A1 * | 12/2012 | Zhao | ................. | H03M 1/0604 341/118 |
| 2013/0249728 A1 * | 9/2013 | Ikeda | ................. | H03M 1/1038 341/155 |

(Continued)

*Primary Examiner* — Linh V Nguyen
(74) *Attorney, Agent, or Firm* — John R. Pessetto; Charles A. Brill; Frank D. Cimino

(57) ABSTRACT

A device includes a capacitive digital to analog converter (CDAC) that further includes a plurality of capacitors to sample an analog input signal. The sampled analog input signal is converted into a digital signal and the digital signal is stored by a successive approximation register (SAR). Thereafter, the SAR regenerates the stored digital signal to a reset plurality of capacitors, and a comparator is configured as an amplifier to generate an equivalent analog voltage of the stored digital signal.

8 Claims, 6 Drawing Sheets

(56) References Cited

U.S. PATENT DOCUMENTS

| | | | |
|---|---|---|---|
| 2014/0035771 A1* | 2/2014 | Tsai | H03M 1/12 341/172 |
| 2016/0173114 A1* | 6/2016 | Kibune | H03M 1/1057 341/120 |
| 2016/0212367 A1* | 7/2016 | Utsunomiya | H04N 5/374 |

* cited by examiner

SAMPLE AND HOLD CIRCUIT WITH INDEFINITE HOLDING TIME

BACKGROUND

A sample and hold circuit is used in a variety of applications such as oscilloscopes, analog demodulators, gesture recognition, and the like. A basic function that the sample and hold circuit performs is to facilitate set triggers in oscilloscopes, perform data demodulation or set demodulation bias levels in radio receivers, store last recorded gestures, etc.

The sample and hold circuit is also used in a successive approximation analog-to-digital converter which is a type of analog-to-digital converter that converts a continuous analog waveform to a discrete digital representation via a binary search.

SUMMARY

A sample and hold circuit includes a capacitive digital to analog converter (CDAC) that further includes a plurality of capacitors to sample an analog input signal. A comparator, which is coupled to the CDAC, converts the sampled analog input signal into a digital signal that is stored in a successive approximation register (SAR). Thereafter, the SAR regenerates the stored digital signal to a reset plurality of capacitors, and the comparator is configured as an amplifier to generate an equivalent analog voltage of the stored digital signal.

As described herein, an output of the comparator is coupled to the SAR during the sampling and conversion of the sampled analog input signal into the digital signal. However, for the generation of the equivalent analog voltage of the stored digital signals, the output of the comparator is fed back to its inverting input. In this case, the comparator operates as an amplifier that amplifies an output of the plurality of capacitors that were recharged with the regenerated stored digital signals.

BRIEF DESCRIPTION OF THE DRAWINGS

The detailed description is described with reference to accompanying figures. In the figures, the left-most digit(s) of a reference number identifies the figure in which the reference number first appears. The same numbers are used throughout the drawings to reference like features and components.

DETAILED DESCRIPTION

Figure 1:
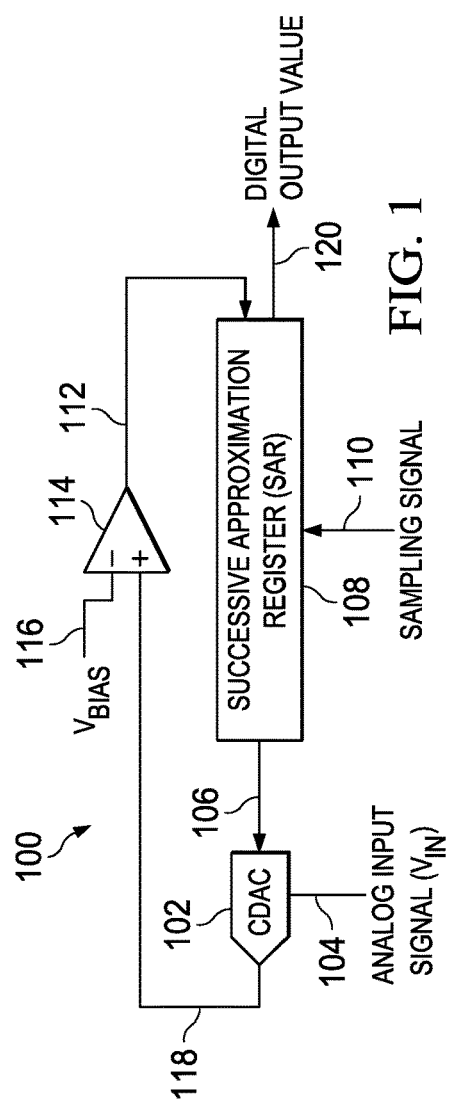
FIG. 1 is an example block diagram of a successive approximation register analog-to-digital converter (SAR ADC) that implements a sample and hold circuit (S&H circuit) with indefinite holding time as described herein.

FIG. 1 is a block diagram of a device 100. The device 100 is a sample and hold circuit for data converters. In described embodiments herein, the device 100 is a successive approximation register analog-to-digital converter (SAR ADC). Therefore, in certain instances, the device 100 is also referred to as SAR ADC 100.

As depicted, the SAR ADC 100 includes: a capacitive digital-to-analog converter (CDAC) 102 that receives an analog input signal (Vin) 104 and a control signal 106; a successive approximation register (SAR) 108 that is coupled to the CDAC 102 where the SAR 108 receives a sampling signal 110 and a comparator output 112; and a comparator 114 that is coupled to the SAR 108. The SAR ADC 100 further shows the comparator 114 to receive a biasing voltage (Vbias) 116, and an analog signal output 118 from the CDAC 102. Furthermore still, the SAR 108 shows a digital output value 120 that includes a digital representation of the sampled Vin 104.

In an embodiment, the SAR ADC 100 can be configured to be in a conversion mode. In the conversion mode, the SAR ADC 100 samples the Vin 104 through the CDAC 102. Thereafter, the SAR ADC 100 performs a binary search to convert the sample of the Vin 104 to its digital equivalence. For example, the binary search includes "N" (where N is an integer number) conversion cycles to determine an N-bit digital value that best represents the sample of the Vin 104. In this example, the control signal 106 facilitates successive switching of capacitors, as further described below, of the CDAC 102 to generate the N-bit digital value of the sampled Vin 104. In this conversion mode, the output of the comparator 114 is fed back to the SAR 108.

As described herein, the SAR 108 is configured to store the N-bit digital value of the sampled Vin 104. Furthermore, the SAR 108 provides the control signal 106 to the CDAC 102. The control signal 106 can include a clock signal used to trigger the sampling of the Vin 104, conversion of the sampled Vin 104, and the regeneration of the stored N-bit digital signal to a reset CDAC 102 as described herein.

Figure 2:
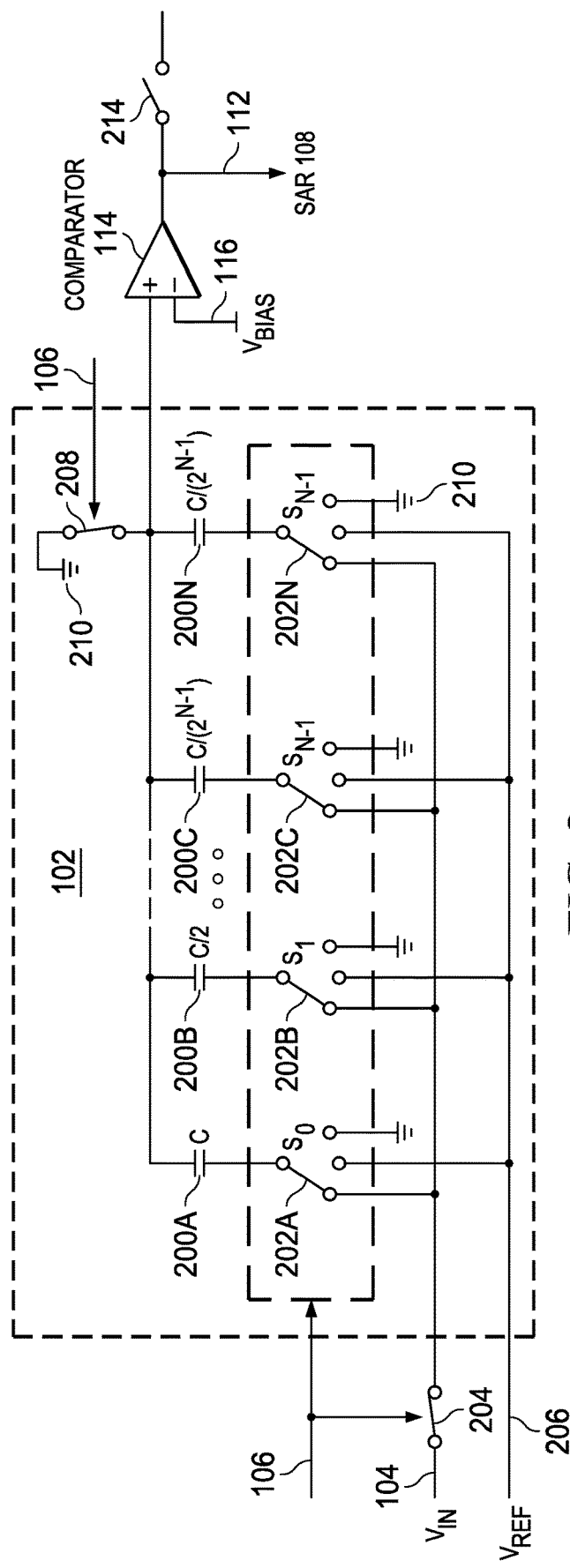
FIG. 2 is an example implementation of a CDAC and a comparator of the SAR ADC during a sampling of an analog input signal as described herein.

After charging the reset CDAC 102 with the regenerated N-bit digital signal, the comparator 114 is configured to act as an amplifier in order to amplify the output (i.e., analog signal output 118) of the CDAC 102. The output of the amplifier includes an equivalent analog voltage of the stored N-bit digital signals FIG. 2 illustrates an example implementation of the CDAC 102 and the comparator 114 of the SAR ADC 100 during a sampling of the analog input signal as described herein. The sampling, for example, is triggered by the clock signal (not shown) from the control signal 106. In this example, the clock signal can be derived from an external sampling signal 110 that is received by the SAR 108.

As shown, the CDAC 102 includes a plurality of "N" capacitors 200, plurality of "N" switches 202, the input voltage (Vin) 104 with a Vin switch 204, a reference voltage (Vref) 206, a grounding switch 208, a plurality of grounds 210, the comparator 114, an output voltage (Vout) 212 with a Vout switch 214, and the feedback 112 that connects an output of the comparator 114 to the SAR 108. The CDAC 102 further shows the control signal 106 that controls the plurality of switches 202, the Vin switch 204, and the grounding switch 208.

In an embodiment, the Vin 104 is sampled through the plurality of capacitors 200A, 200B, 200C, to 200-N where N is a number of quantization bits used for the sampling. For example, capacitors 200A to 200D are used to sample the Vin 104. In this example, the equivalent number of bits for this sampling is at least four bits (i.e., N=4). That is, each sampling may be represented by four-bit digital signals at the digital output value 120. Consequently, each capacitor of the plurality of capacitors 200 is configured to charge a certain voltage depending upon the amount of the Vin 104 to be sampled.

To implement the sampling of the Vin 104, the control signal 106 transmits, for example, a control signal such as a clock signal to the CDAC 102. This clock signal facilitates activation of the plurality of switches 202, the Vin switch 204 and the grounding switch 208. The activation of the Vin switch 204 connects one end of the plurality of capacitors 200 to the Vin 104, while the activated grounding switch 208 connects the other ends of the plurality of capacitors 200 to the ground 210. In this example, each capacitor of the plurality of capacitors 200 will be charged to a corresponding value depending upon a value of the Vin 104 to be sampled. In the example above where N is four bits, a maximum value of the Vin 104 may charge each capacitor of the plurality of capacitors 200 to their corresponding maximum value.

For example, for sixteen volts—maximum value with N=4, then the capacitors 200A to 200D will be charged to their corresponding maximum charging values. In this example, the corresponding maximum charging values include 8V, 4V, 2V, and 1V for the capacitors 200A to 200D, respectively. That is, at the maximum value, each of the capacitors 200A to 200D will correspond to a value of bit one i.e., "1111."

In another example where the sampled value of the Vin 104 is one volt, then the least significant bit (LSB)—capacitor 200D is charged to its maximum value. In this other example, the charges of the capacitors 200A to 200D correspond to bit values "0001."

During the sampling of the Vin 104 as described above, the Vout 212 is disconnected from an output of the comparator 114. In other words, the Vout switch 214 is open, and the SAR ADC 100 is not generating an equivalent analog voltage of the N-bit digital value.

Figure 3:
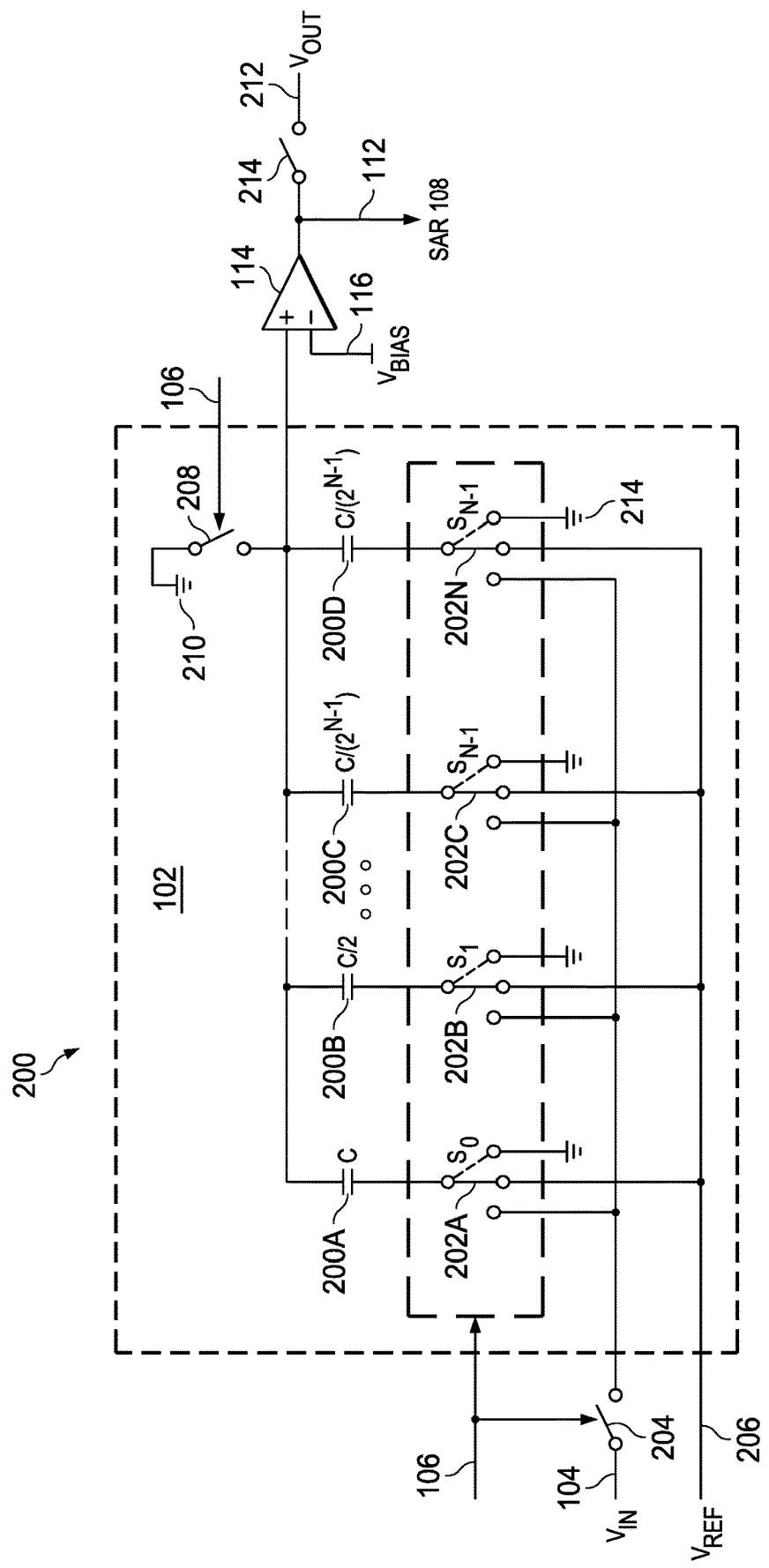
FIG. 3 is an example implementation of a CDAC and a comparator of the SAR ADC during a device conversion mode as described herein.

FIG. 3 illustrates an example implementation of the CDAC 102 and the comparator 114 of the SAR ADC 100 during the conversion mode as described herein.

After the sampling of the Vin 104 as described above in FIG. 2, the SAR ADC 100 is configured to perform the conversion of the sampled analog Vin 104 into N-bit digital signals. The N-bit digital signals includes the N-bit digital value that corresponds more or less to the sampled Vin 104. The small difference or variation is due to quantization errors during the sampling.

For example, in the case where the Vin 104 is sampled through the capacitors 200A to 200D, then the N-bit digital signal is configured to have four bits (i.e., N=4). In this example, the number of capacitors 200 may be limited to at least four capacitors to generate bits 0000 to 1111.

As depicted, the controls signal 106 can activate successively the plurality of switches 202 in order to connect each of the plurality of capacitors 200 to the Vref 206. On the other hand, the control signal 106 can inactivate the Vin switch 204, the grounding switch 208, and the Vout switch 214 during the process of converting the charges of the plurality of capacitors 200 into its N-bit digital signals.

In an embodiment, different amounts of Vref 206 from the control signal 106 are utilized to detect which particular capacitor or capacitors in the plurality of capacitors 200 were charged during the sampling of the Vin 104.

For example, after the sampling of the Vin 104 in FIG. 1 above, the most significant bit (MSB) is determined by connecting the switch 202A to the Vref 206 while the rest of the plurality of switches 202 are connected to the ground 210. The combination (e.g., difference) between the charges of the capacitor 200A and the Vref 206 is compared by the comparator 114 to the Vbias 116 in order to obtain the MSB. In this example, a comparison output is used to set the MSB to be a logic 1 or 0.

For example, if the capacitor 200A does not have any charge, then the comparison output from the comparator 114 is used as a basis for changing the MSB state to logic 0. Otherwise, the resulting comparison is used to maintain the logic 1 for the MSB. Thereafter, a similar procedure is performed on the capacitor 200B until the N-bit digital signals are determined.

In an embodiment, the SAR 108 acts like a storage or memory for the derived N-bit digital signals above (e.g., bits 1111 for charged capacitors 200A to 200D). In this embodiment, the digital signals can be later regenerated to the reset plurality of capacitors 200 as described herein.

Similar to the sampling of the Vin 104 above, the Vout 212 is disconnected from an output of the comparator 114 during the conversion of the sampled Vin 104 into its N-bit digital signals or value. In other words, the Vout switch 214 is open, and the SAR ADC 100 is not generating an equivalent analog voltage of the N-bit digital value.

Figure 4:
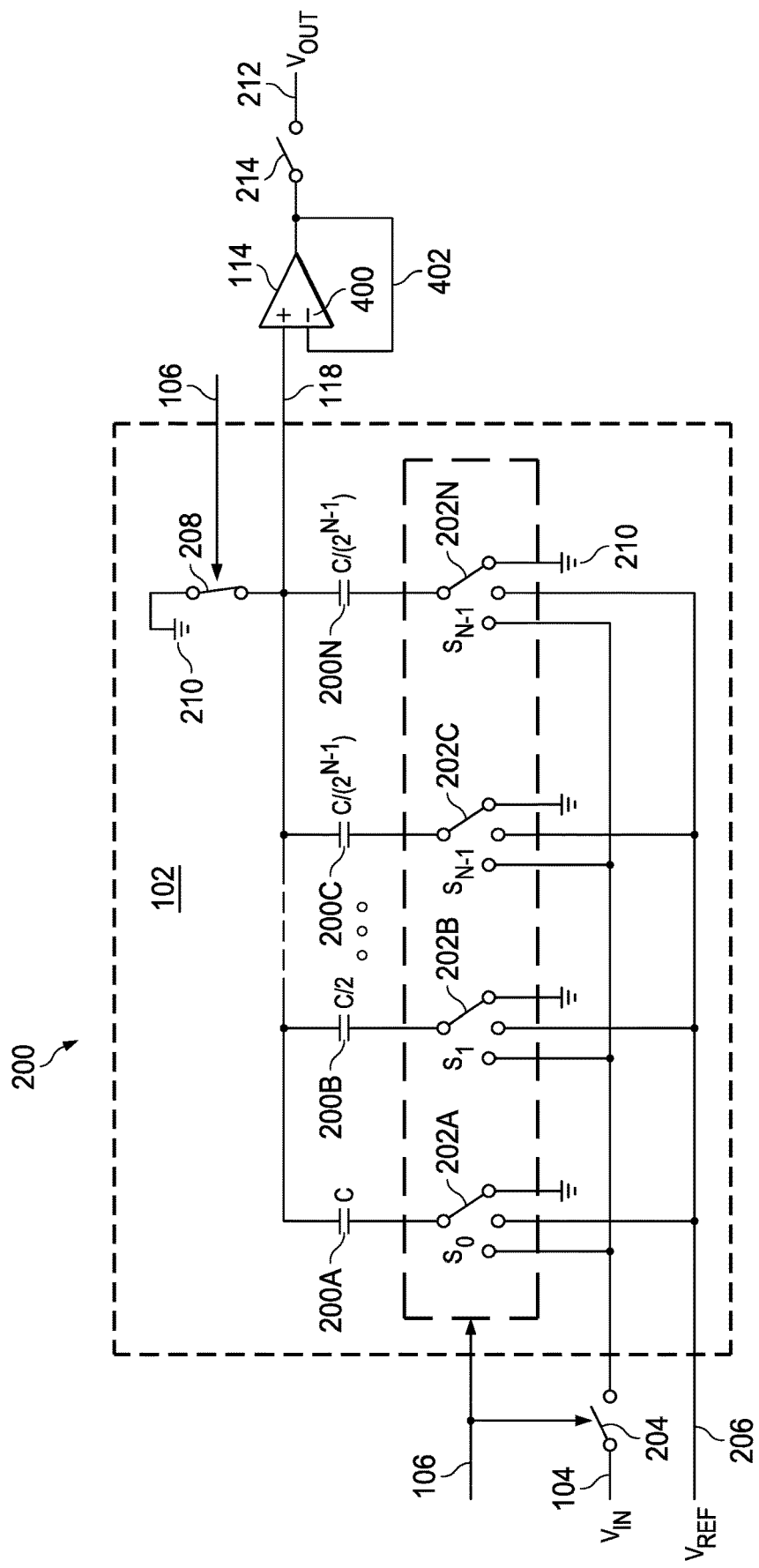
FIG. 4 is an example implementation of a CDAC and a comparator of the SAR ADC during a resetting or removal of voltage on the plurality of capacitors as described herein.

FIG. 4 illustrates an example implementation of the CDAC 102 and the comparator 114 of the SAR ADC 100 during a resetting or removal of voltage charges of the plurality of capacitors as described herein.

After the conversion of the sampled Vin 104 into its N-bit digital equivalence or value as described above in FIG. 3, the CDAC 102 is configured to perform a removal of charges in the plurality of capacitors 200.

In an embodiment, the control signal 106 activates the plurality of switches 202 in order to connect the plurality of capacitors 200 to the grounds 210. Furthermore, the control signal 106 configures the grounding switch 208 to connect the other ends of the plurality of capacitors 200 to the top ground 210 as shown. In this embodiment, both ends of each capacitor of the plurality of capacitors 200 are connected to the ground for capacitor discharging.

For example, in a case where the sampling of the Vin 104 resulted in voltage charges to the capacitors 200A and 200B, the resetting will drain these voltage charges to the ground. In this example, the capacitors 200A and 200B will have zero voltages after being reset.

During the resetting of the plurality of capacitors 200 in the CDAC 102, the comparator 114 can be configured to act as an amplifier by connecting its output to an inverting input 400 in order to form a feedback 402. For example, rather than connecting the comparator output 112 to the SAR 108 during the sampling and conversion of the sampled analog Vin 104, the comparator output 112 is fed back to the inverting input 400 of comparator 114 in order to form the feedback 402. In this example, the configuration of the comparator 114 is transformed to act as an amplifier of the analog output signal 118.

Figure 5:
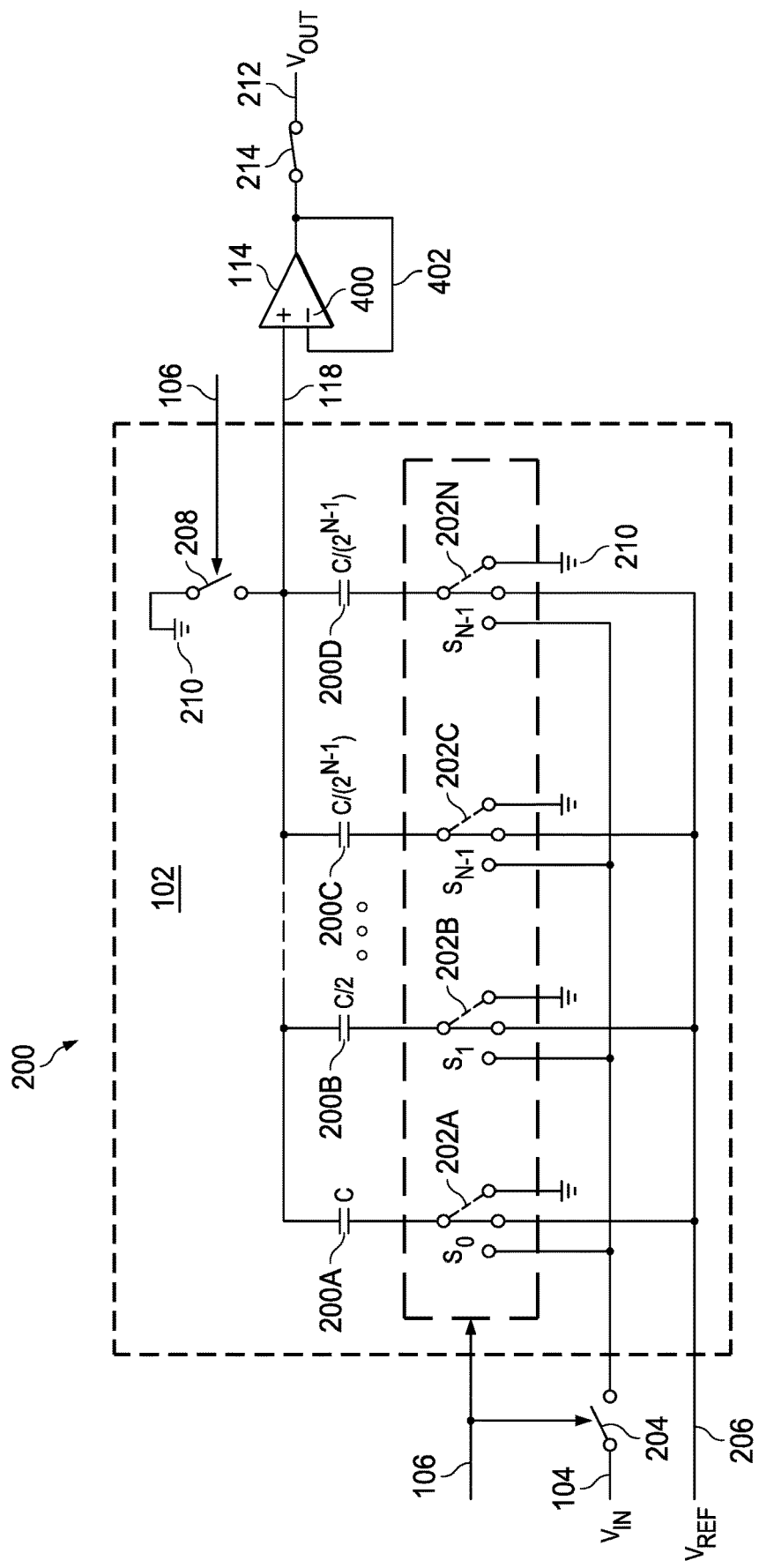
FIG. 5 is an example implementation of a CDAC and a comparator of the SAR ADC during a process of a process of regenerating the sampled analog input voltage as described herein.

Similar to the sampling of the Vin 104 and the conversion of the sampled Vin 104 above, the Vout 212 is disconnected from an output of the comparator 114 during the resetting of the CDAC 102. In other words, the Vout switch 214 is open, and the SAR ADC 100 is not generating an equivalent analog voltage of the N-bit digital value FIG. 5 illustrates an example implementation of the CDAC 102 and the comparator 114 of the SAR ADC 100 during a process of regenerating the sampled analog input voltage as described herein.

After the conversion of the sampled Vin 104 to its N-bit digital value, the removal of charges in the plurality of capacitors 200 as described above, and the resetting of the CDAC 102, the stored N-bit digital equivalence can be regenerated and resupplied by the SAR 102 to the plurality of capacitors 200. During the regeneration of the N-bit digital equivalence or value, the comparator 114 is configured to act as an amplifier for the analog output signal 118 that the comparator 114 receives from the CDAC 102.

In an embodiment, the regenerated N-bit digital signals can be coupled to the plurality of capacitors 200 through the control signal 106. For example, for the regenerated digital signals with logic bits "1000," the most significant bit (MSB)—capacitor 200A will be charged to its maximum value to correspond to the logic 1, while the capacitors 200B-200D are not charged (i.e., connected to the ground 210) to correspond to the logic 0s. In this example, the capacitor 200A is charged by to its maximum value by connecting it to the Vref 206. In this example still, the control signal 106 facilitates the activation of the switch 202A in order to connect the capacitor 200A to the Vref 206. This connection corresponds to the logic 1 in the MSB.

As described herein, the comparator turned amplifier can provide the equivalent analog voltage signal of the regenerated N-bit digital value at the Vout 212. The steps of sampling, converting, resetting, configuring the comparator to act as an amplifier, and the regenerating of the N-bit digital value overcomes the droop in the CDAC 102 as described herein.

Figure 6:
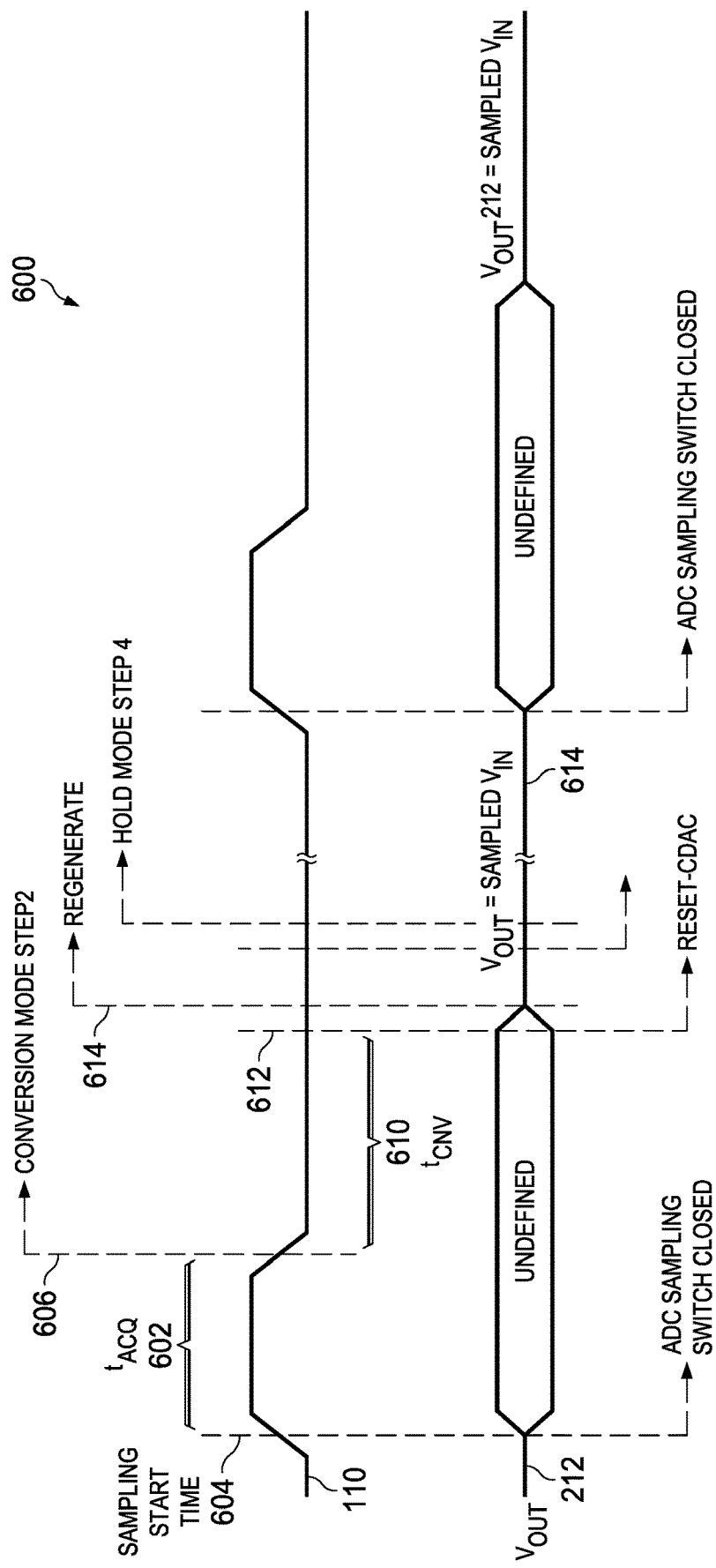
FIG. 6 is an example timing diagram illustrating an operation of the SAR ADC as described herein.

FIG. 6 illustrates an example timing diagram 600 illustrating an operation of the SAR ADC 100 as described herein.

As depicted, a time of acquisition ($t_{ACQ}$) 602 is a sampling period of the Vin 104 where the sampling period includes a difference between a signal sampling start time 604 and a conversion start time 606. In an embodiment, the signal sampling start time 604 and conversion start time 606 include a rising edge and a falling edge, respectively, of a sample control signal 608. In this embodiment, the sample control signal 608 is similar to the clock signal from the control signal 106 where the clock signal is used as a reference for the sampling of the Vin 104. As shown, the $t_{ACQ}$ 602 includes the time when the Vin 104 is sampled by the plurality of capacitors 200 of the CDAC 102.

On the other hand, a conversion time period ($t_{CNV}$) 610 is triggered by the falling edge of the clock signal or the sample control signal 608. The falling edge of the sample control signal 608 initiates the conversion start time 606. In an embodiment, the $t_{CNV}$ 608 includes a time period where the sampled Vin 104 is converted into N-bit digital signals after N-conversion cycles. In this embodiment, the taw 610 includes a time difference between a reset start time 612 and the conversion start time 606. The reset start time 610, for example, includes the time when the plurality of capacitors 200 are connected to the circuit ground 210.

In an embodiment, the Vout 212 is undefined (i.e., no output) during the sampling period up to the reset start time 612. The reason being, the Vout switch 214 disconnects the Vout 212 from the comparator 114. However, upon regeneration of the N-bit digital signals to the plurality of capacitors 200 at regeneration start time 614, and upon configuration of the comparator 114 to act as an amplifier, the Vout 212 includes the analog signals that are more or less equal to the sampled analog Vin 104.

Figure 7:
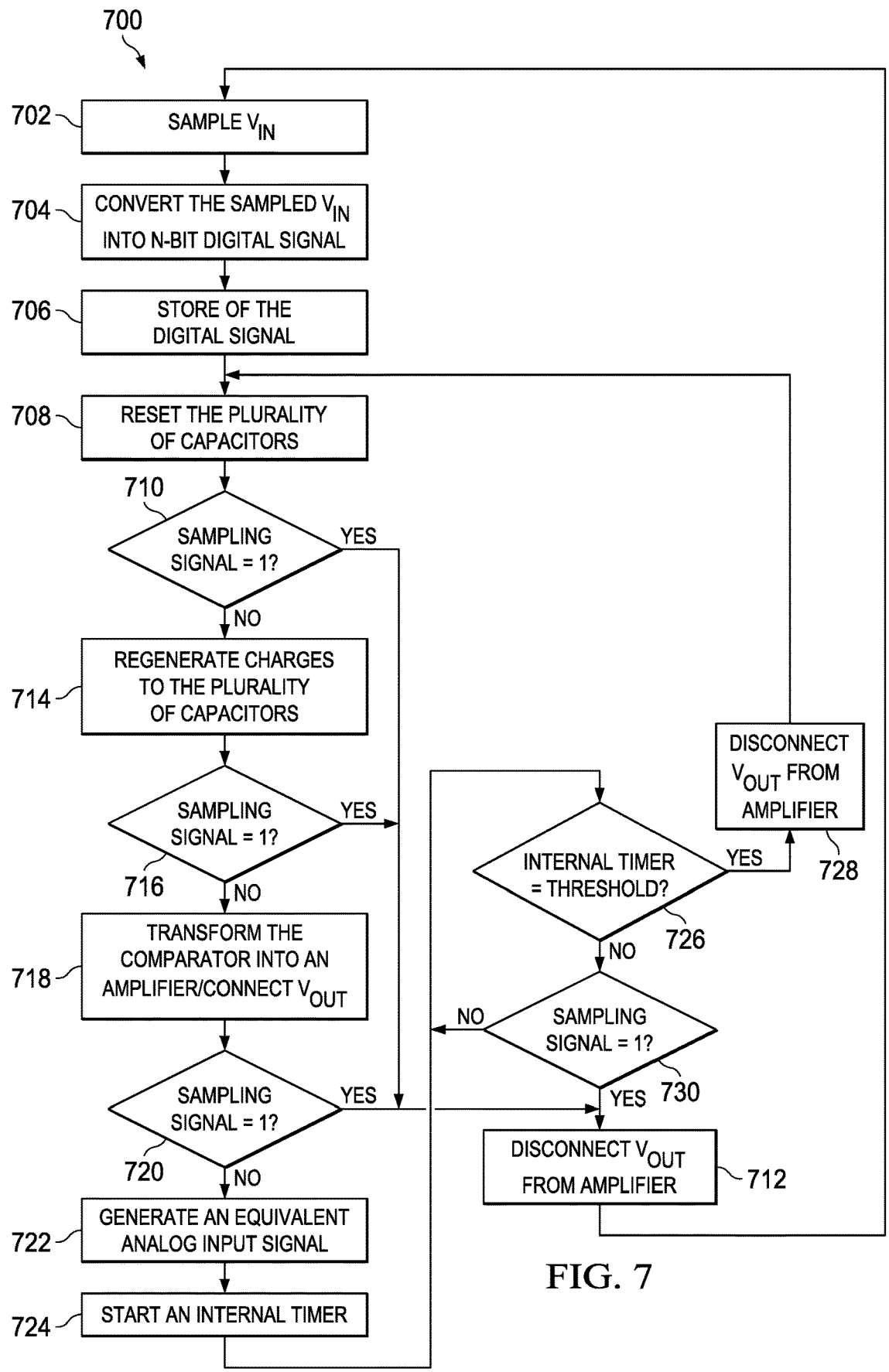
FIG. 7 is an example process chart illustrating an example method for using SAR-ADC building blocks to generate an analog output as described herein.

FIG. 7 shows an example process chart 700 illustrating an example method for using SAR-ADC building blocks to generate an analog output as described herein. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 702, sampling an analog input signal by a plurality of capacitors is performed. For example, the plurality of capacitors 200 are utilized to sample the Vin 104. In this example, each capacitor of the plurality of capacitors 200 will be charged to a certain value depending upon the amount of the Vin 104 to be sampled.

For example, where N is four bits, a maximum sampling value can charge each capacitor of the plurality of capacitors 200 to their corresponding maximum value.

In an embodiment, the sampling of the Vin 104 is performed during the $t_{ACQ}$ 602 time period as shown in FIG. 6. In this embodiment, the sampling is implemented when the clock signal of the sample control signal 608 is at logic high.

At block 704, conversion of the sampled analog input signal into digital signals by a comparator. For example, starting from the falling edge (i.e., conversion start time 606) of the sample control signal 608, the SAR ADC 100 is configured to perform a conversion of the sampled analog Vin 104 into N-bit digital signals. In this example, the control signal 106 is utilized to facilitate the N-conversion cycles to derive the N-bit digital signals. In this example still, the clock signal of the sample control signal 608 is at logic low.

At block 706, storing of the digital signals by a successive approximation register (SAR) is performed. For example, the SAR 108 or SAR logic 108 acts as a memory for storage of the N-bit digital signals.

At block 708, reset the plurality of capacitors is performed. For example, both ends of each capacitor in the plurality of capacitors 200 are connected to the ground. In this example, the control signal 106 facilitates the grounding of the plurality of capacitors 200.

At block 710, a determination is made if the sampling signal is equal to "1." If the determination is "YES", then at block 712 is performed.

At block 712, Vout is disconnected from the amplifier. If the determination is "NO" at block 710, then block 714 is performed.

At block 714, regenerating charges to the plurality of capacitors based on the digital signals stored in the SAR is performed. For example, the SAR 108 regenerates the stored N-bit digital signals by supplying the logic bits to the CDAC 102. In this example, the plurality of capacitors 200 of the CDAC 102 generates the equivalent analog signal of the digital signals 300.

At block 716, a determination is made if the sampling signal is equal to "1." If the determination is "YES", then at block 712 is performed.

At block 712, Vout is disconnected from the amplifier. If the determination is "NO" at block 716, then block 718 is performed.

At block 718, transforming the comparator to an amplifier is performed. For example, the output of the comparator 114 is fed back to its inverting input. In this example, the comparator is configured to act as amplifier i.e., amplifier-comparator.

At block 720, a determination is made if the sampling signal is equal to "1." If the determination is "YES", then at block 712 is performed.

At block 712, Vout is disconnected from the amplifier. If the determination is "NO" at block 720, then block 722 is performed.

At block 722, generating an equivalent analog input signal by the comparator-turned-amplifier is performed. For example, the Vout 212 generates the equivalent analog input signal that is more or less equal to the sampled analog input signal 104 at block 702. In this example, the comparator 114, acting as amplifier, amplifies the analog output signal 118, which is the equivalent analog value of the regenerated N-bit digital signals.

At block 724, start an internal time is performed. For example, the internal timer is the logic low of the clock signal of the sample control signal 608. In this example, the internal time starts when the Vout switch 214 connects the Vout 212 to the output of the comparator-turned-amplifier.

At block 726, a comparison of the internal time to a threshold value is performed. For example, the threshold value is configured to include a time period upon which the Vout 212 is generating the equivalent analog input signal. In this example, when the threshold value is at least equal to the internal time, then at block 728, the Vout 212 is disconnected from the comparator-turned-amplifier. Upon disconnection, the process goes back again to the resetting of the plurality of capacitors at block 708.

Otherwise, if the internal time is less than the threshold value, then at block 730, a determination is made if the sampling signal is equal to "1." If the determination is "YES", then at block 712 is performed.

At block 712, Vout is disconnected from the amplifier. If the determination is "NO" at block 720, then at 726 a comparison of the internal time to a threshold value is performed.

What is claimed is:

1. A sample and hold circuit comprising:
    a capacitive digital to analog converter (CDAC) that comprises:
        a plurality of capacitors to sample an analog input signal;
        a ground coupled to the plurality of capacitors, wherein the ground provides resetting of the plurality of capacitors after the sampling of the analog input signal;
    a comparator having a first input, a second input and an output wherein the first input is coupled to the plurality of capacitors, wherein the comparator converts the sampled analog input signal into a digital signal;
    a successive approximation register (SAR) that receives and stores the digital signal wherein the SAR regenerates and couples the digital signal to the plurality of capacitors of the CDAC; and
    a plurality of switches to connect the plurality of capacitors to the ground to reset the plurality of capacitors;
    wherein when the plurality of capacitors is reset to ground, the second input of the comparator is directly coupled to the output of the comparator;
    wherein the resetting is performed after the conversion of the sampled input signal into the digital signal.

2. The sample and hold circuit of claim 1, wherein during a conversion mode, the digital signal is derived by comparing a voltage on of the plurality of capacitors to a biasing voltage (Vbias).

3. The sample and hold circuit of claim 1 further comprising a control signal that is provided by the SAR to the CDAC, wherein the control signal includes a clock signal with a rising edge that triggers the sampling by the CDAC.

4. The sample and hold circuit of claim 3, wherein a falling edge of the clock signal triggers a conversion mode that includes the conversion of the sampled analog input signal into the digital signal.

5. A successive approximation register analog to digital converter (SAR ADC) comprising:
    a plurality of capacitors to sample an analog input signal;
    a comparator having a first input, a second input and an output wherein the first input is coupled to the plurality of capacitors, wherein the comparator converts the sampled analog input signal into a digital signal;
    a successive approximation register (SAR) that stores the digital signal, wherein the SAR regenerates and couples the stored digital signal to the plurality of capacitors;
    a plurality of switches to connect the plurality of capacitors to ground to reset the plurality of capacitors;
    wherein when the plurality of capacitors is reset to ground, the second input of the comparator is directly coupled to the output of the comparator;
    wherein the resetting is performed after the conversion of the sampled input voltage signal into the digital signal.

6. The SAR ADC of claim 5, wherein the comparator derives the digital signal by comparing capacitor charges of the plurality of capacitors to a biasing voltage (Vbias).

7. The SAR ADC of claim 5 further comprising a control signal that is provided by the SAR to the plurality of capacitors, wherein the control signal includes a clock signal with a rising edge that triggers the sampling of the analog input signal.

8. The SAR ADC of claim 7, wherein a falling edge of the clock signal triggers a conversion mode that includes the conversion of the sampled analog input signal into the digital signals.

* * * * *